(12) United States Patent
Chou et al.

(10) Patent No.: US 11,978,641 B2
(45) Date of Patent: May 7, 2024

(54) WAFER BONDING METHOD AND SEMICONDUCTOR STRUCTURE OBTAINED BY THE SAME

(71) Applicant: TAIWAN SEMICONDUCTOR MANUFACTURING COMPANY, LTD., Hsinchu (TW)

(72) Inventors: Pei-Yu Chou, Hsinchu (TW); Yen-Yu Chen, Hsinchu (TW); Meng-Ku Chen, Hsinchu (TW); Shiang-Bau Wang, Hsinchu (TW); Tze-Liang Lee, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 17/832,969

(22) Filed: Jun. 6, 2022

(65) Prior Publication Data
US 2023/0395392 A1    Dec. 7, 2023

(51) Int. Cl.
*H01L 21/321* (2006.01)
*H01L 21/463* (2006.01)

(52) U.S. Cl.
CPC ...... *H01L 21/32115* (2013.01); *H01L 21/463* (2013.01)

(58) Field of Classification Search
CPC .................. H01L 21/32115; H01L 21/463
See application file for complete search history.

(56) References Cited

U.S. PATENT DOCUMENTS

| | | | |
|---|---|---|---|
| 2017/0256330 A1* | 9/2017 | Moldovan | C23C 14/042 |
| 2022/0139911 A1* | 5/2022 | Wei | H01L 27/0886 |
| | | | 257/365 |
| 2022/0310556 A1* | 9/2022 | Huang | H01L 21/76801 |

* cited by examiner

*Primary Examiner* — Binh X Tran
(74) *Attorney, Agent, or Firm* — Birch, Stewart, Kolasch & Birch, LLP

(57) ABSTRACT

A method for manufacturing a semiconductor structure includes: forming a semiconductor device on a main region of the device substrate, the device substrate having a peripheral region surrounding the main region; forming a first filling layer on the peripheral region of the device substrate; forming a second filling layer over the first filling layer and the semiconductor device after forming the first filling layer, the second filling layer having a polishing rate different from that of the first filling layer; performing a planarization process over the second filling layer to remove a portion of the second filling layer so that a remaining portion of the second filling layer has a planarized surface opposite to the device substrate; and bonding the device substrate to a carrier substrate through the first filling layer and the remaining portion of the second filling layer.

20 Claims, 10 Drawing Sheets

WAFER BONDING METHOD AND SEMICONDUCTOR STRUCTURE OBTAINED BY THE SAME

BACKGROUND

The semiconductor integrated circuit (IC) industry has, over the decades, experienced tremendous advancements and is still undergoing vigorous development. With dramatic advances in technology, the industry pays much attention on the development of small IC devices with high performance and low cost. Since substrate is an important component of semiconductor devices, substrate bonding issue needs be solved in order to facilitate manufacturing process of semiconductor devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
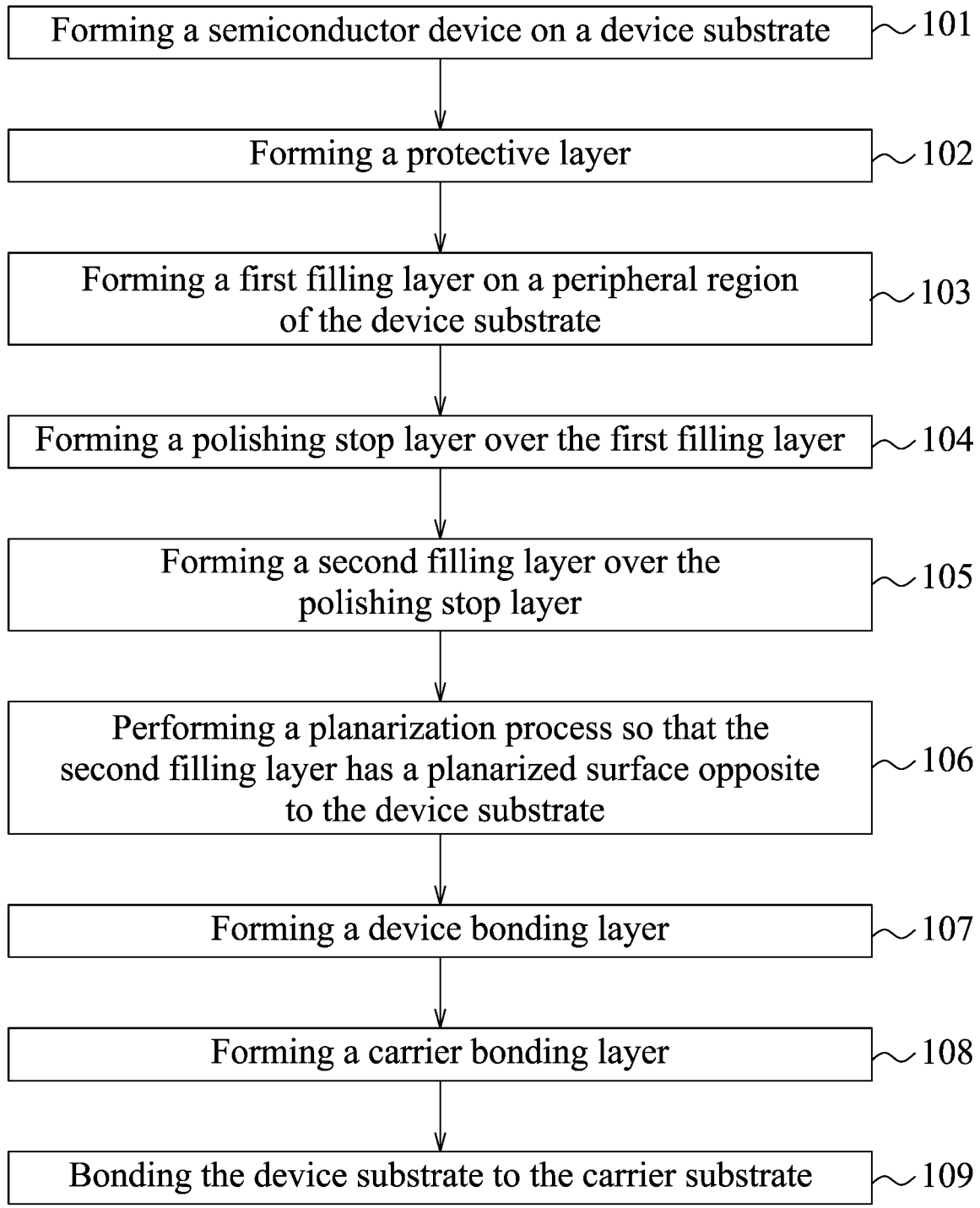
FIG. 1 is a flow diagram of a method for making a semiconductor structure in accordance with some embodiments of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "on," "above," "over," "below," "upper," "lower," "inner," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is directed to a substrate bonding method and a semiconductor structure obtained by the same. In the method, the semiconductor structure involves two substrates being bonded to each other with improved bonding. The present disclosure provides an exemplary method to manufacture, for example, but not limited to, a semiconductor structure including a device substrate and a semiconductor device bonded to a blank substrate serving as a carrier substrate, as shown in FIG. 10. The semiconductor structure may be further applied in any appropriate applications, for instance, backside illumination complementary metal-oxide-semiconductor image sensor, digital signal processors, memory devices, analog processors, radio frequency (RF) circuits, resistors, inductors and capacitors. Other suitable applications are within the contemplated scope of the disclosure. FIG. 1 is a flow diagram illustrating the exemplary method for manufacturing the exemplary semiconductor structure as shown in FIG. 10 in accordance with some embodiments. FIGS. 2 to 10 illustrate schematic views of intermediate stages of the method. Some portions are omitted in FIGS. 2 to 10 for the sake of brevity. Additional steps can be provided before, after or during the method, and some of the steps described herein may be replaced by other steps or be eliminated.

Figure 2:
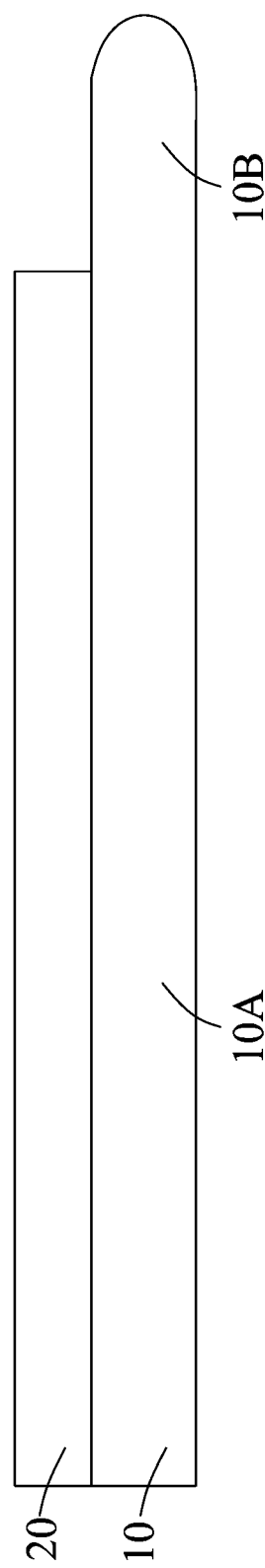
FIGS. 2 to 10 are schematic views illustrating intermediate stages of the method in accordance with some embodiments of the present disclosure.

Referring to FIG. 1 and the example illustrated in FIG. 2, the method begins at step 101, where a semiconductor device 20 is formed on a device substrate 10.

The device substrate 10 has a main region 10A and a peripheral region 10B surrounding the main region 10A. The device substrate 10 may have a predetermined thickness and a predetermined radius such that the device substrate 10 are suitable to be processed in subsequent steps. In some exemplary embodiments, the device substrate 10 may be a "12 inch" substrate, i.e., having a radius of approximately 150 mm, with a thickness of approximately 765 µm to 775 µm. Other size and/or thickness suitable for the device substrate 10 are within the contemplated scope of the present disclosure.

The device substrate 10 may be, for example, but not limited to, a silicon-on-insulator (SOI) substrate, a germanium-on-insulator (GOI) substrate, a bulk semiconductor substrate, or the like. The substrate 10 may have multiple layers. The device substrate 10 may include, for example, elemental semiconductor materials, such as crystalline silicon, diamond, or germanium; compound semiconductor materials, such as silicon carbide, gallium arsenic, indium arsenide, gallium phosphide, indium arsenide, indium phosphide, or indium antimonide; alloy semiconductor materials, such as silicon germanium, silicon germanium carbide, gallium arsenic phosphide, aluminum gallium arsenide, or gallium indium phosphide; or combinations thereof. The device substrate 10 may be intrinsic or doped with a dopant or different dopants. Other materials suitable for the device substrate 10 are within the contemplated scope of the present disclosure.

The semiconductor device 20 is formed on the main region 10A of the device substrate 10, leaving the peripheral region 10B unoccupied. The semiconductor device 20 may include a front-end-of-line (FEOL) portion formed on the device substrate 10 and including, for instance, a logic circuitry with transistors, a memory circuitry having memory elements, passive elements, and/or other suitable elements; a middle-end-of-line (MEOL) portion formed on the FEOL portion and including, for example, metal contacts to be electrically connected to electrodes of the elements in the FEOL portion (for example, but not limited to, gate, source, and drain electrodes of the transistors), interlayer dielectric (ILD) layers among the metal contacts, and or other suitable elements; and a back-end-of-line (BEOL) portion formed on the MEOL portion and including, for example, metallization layers (metal lines or vias) formed to electrically connect the metal contacts to an external circuitry out of the semiconductor device 20, and additional ILD layers among the metallization layers. The semiconductor device 20 may be formed using any appropriate materials and/or methods. In some embodiments, the BEOL portion may further include a protective dielectric layer which is formed opposite to the MEOL portion, and which may serve as an etch stop layer so as to protect other elements of the BEOL portion formed therebeneath from being damaged due to steps performed subsequently. The protective dielectric layer may include a dielectric nitride such as silicon nitride, silicon carbon nitride, or other suitable materials. Other suitable materials and methods for forming the semiconductor device 20 are within the contemplated scope of the present disclosure.

The semiconductor device 20 may have a predetermined size and thickness according to layout of the design. In some exemplary embodiments, when the device substrate 10 is a "12 inch" wafer having a radius of approximately 150 mm, the main region 10A may have a radius of approximately 148 mm, and thus the peripheral region 10B is located to be spaced apart from a center of the device substrate 10 by a distance that ranges from approximately 148 mm to 150 mm. It should be noted that other suitable sizes of the main region 10A and the peripheral region 10B are within the contemplated scope of the present disclosure.

Figure 3:
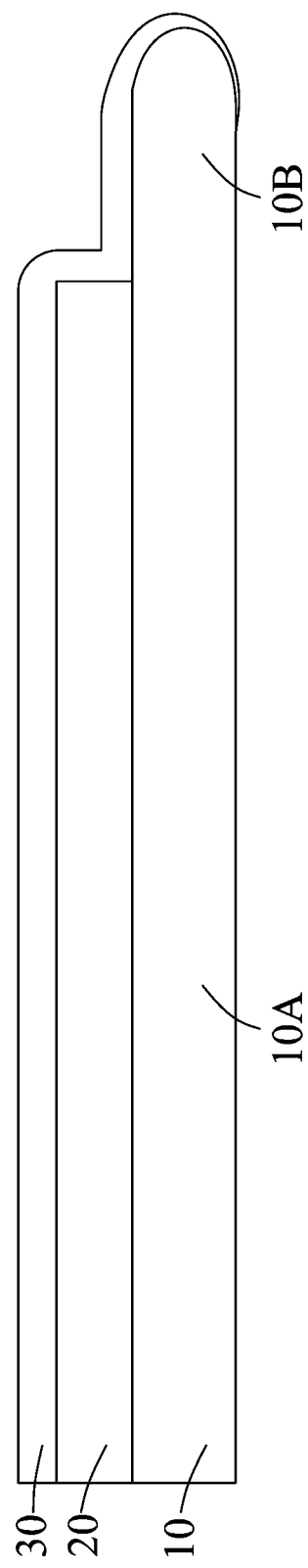

Referring to FIG. 1 and the example illustrated in FIG. 3, the method proceeds to step 102, where a protective layer 30 is formed over the semiconductor device 20 and the device substrate 10. The protective layer 30 is configured to protect the semiconductor device 20 from other elements, e.g., oxide materials formed in steps to be performed subsequently. In particular, the protective layer 30 is formed to avoid any metals present in the semiconductor device 20 being exposed to the oxide materials, thereby preventing reactions between metals of the semiconductor device 20 and such oxide materials. In certain embodiments, the protective layer 30 includes, for example, but not limited to, undoped silicate glass (USG). The protective layer 30 may be formed by any suitable deposition processes, for example, but not limited to, plasma enhanced chemical vapor deposition (PECVD). Other suitable materials and methods for forming the protective layer 30 are within the contemplated scope of the present disclosure. It is to be noted that in some embodiments, step 102 is optional, i.e., the protective layer 30 may be omitted.

Figure 4:
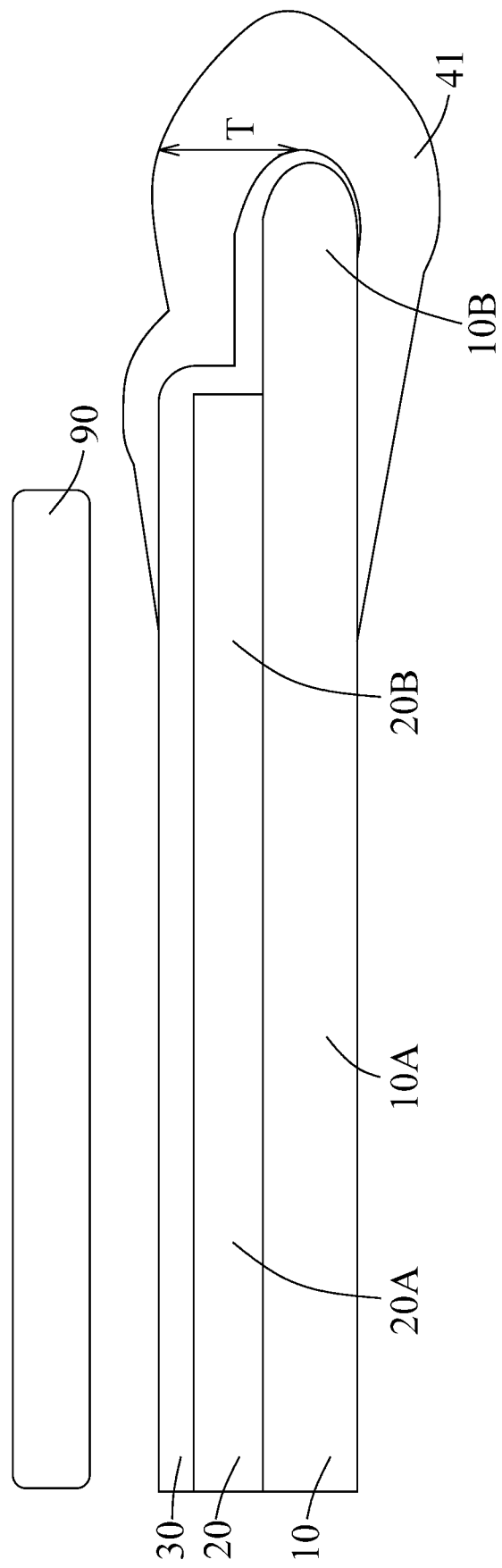

Referring to FIG. 1 and the example illustrate in FIG. 4, the method proceeds to step 103, where a first filling layer 41 is formed on the peripheral region 10B of the device substrate 10, and on the protective layer 30 (if step 102 is performed). In some embodiments, in addition to the peripheral region 10B of the device substrate 10, the first filling layer 41 is also formed on an end portion 20B of the semiconductor device 20 as shown in FIG. 4, so as to ensure a thorough coverage over the peripheral region 10B of the device substrate 10. A major portion 20A of the semiconductor device 20 steers clear of the first filling layer 41.

On the peripheral region 10B of the device substrate 10, relative to the device substrate 10, an upper surface of the first filling layer 41 opposite to the device substrate may be at a level not lower than that of an upper surface of the semiconductor device opposite to the device substrate 10. In some embodiments, the first filling layer 41 is formed with a maximal thickness (T) ranging from about 0.5 µm to about 3.0 µm. In some embodiments, a lowest point on the upper surface of the first filling layer 41 located on the peripheral region 10B of the device substrate 10 is at a level not lower than those of all points on the upper surface of the semiconductor device 20.

In certain embodiments, step 103 may include sub-steps of (i) disposing a blocking element 90 above the semiconductor device 20 opposite to the device substrate in a manner that the blocking element 90 is spaced apart from the semiconductor device 20 and the protective layer 30 (if step 102 is performed), and (ii) performing a deposition process so as to form the first filling layer 41 on the peripheral region 10B of the device substrate 10.

The configuration of the blocking element 90 permits, in sub-step (ii), the first filling layer 41 to be selectively formed on the peripheral region 10B of the device substrate 10 and the end portion 20B of the semiconductor device 20, rather than being formed over the entire device substrate 10 and the semiconductor device 20. That is, when a precursor for forming the first filling slayer 41 is applied over the device substrate 10 and the semiconductor device 20, a portion of the precursor is blocked by the blocking element 90 and is forced to the peripheral region 10B of the device substrate 10 and/or the end portion 20B of the semiconductor device 20, instead of reaching the major portion of the semiconductor device 20. It is noted that the first filling layer 41 may have a non-uniform thickness, e.g., in certain embodiments, the first filling layer 41 is formed to wrap the peripheral region 10B of the device substrate 10 in a manner that the first filling layer 41 is formed with a thickness that gradually decreases toward the main region of the device substrate 10. By adjusting the size and/or configuration of the blocking element 90, it is possible to regulate size, shape and/or thickness of the first filling layer 41 thus formed.

In certain embodiments, one blocking element 90 is employed to assist formation of the first filling layer 41. Alternatively, in other embodiments, two blocking elements may be employed by further disposing another blocking element 90 above the device substrate 10 opposite to the semiconductor device 20, such that the device substrate 10 and the semiconductor device 20 (together with the protective layer 30 if step 102 is performed) are interposed between the two blocking elements 90. With such configuration, the first filling layer 41 is mainly formed on the side of the device substrate having the semiconductor device 20, leaving the opposite side of the device substrate vacant. In some embodiments, the blocking elements 90 may be placed in a symmetrical manner. In some other embodiments, the blocking elements 90 may be placed in an unsymmetrical manner. The disposal of the two blocking elements 90 may be determined according to a desired shape, size, and/or thickness of the first filling layer 41.

In certain embodiments, the first filling layer 41 includes a first dielectric material having at least one of an oxide, a nitride, and a carbide. Examples of the first dielectric material are silicon oxide ($SiO_x$), silicon nitride ($SiN_x$), silicon oxynitride (SiON), silicon carbon nitride (SiCN), silicon carbon (SiC), or combinations thereof. Other suitable materials for forming the first filling layer 41 are within the contemplated scope of the present disclosure. In some embodiments, the first dielectric material is $SiO_x$. In other embodiments, the first dielectric material is $SiN_x$.

The first filling layer 41 may be formed by any suitable deposition process, for instance, a chemical vapor deposition (CVD) process, a plasma enhanced chemical vapor deposition (PECVD) process, a high-density plasma CVD (HDPCVD) process, a physical vapor deposition (PVD) process or an atomic layer deposition (ALD) process. Other suitable deposition processes for forming the first filling layer 41 are within the contemplated scope of the present disclosure. In some embodiments, the PECVD process, which is known for having a high deposition rate, is adopted so that the first filling layer 41 having a thickness in order of micron meter can be obtained within a short period of time.

In step 103, the PECVD process may be performed at a temperature ranging from about 200° C. to about 500° C., and under a pressure ranging from about 0.1 Torr to about 20 Torr. A precursor for forming the first filling layer 41 including $SiO_x$ using the PECVD process may include, for example, but not limited to, silane ($SiH_4$) or tetraethoxysilane (TEOS), in addition to oxygen, or nitrous oxide ($N_2O$). A precursor for forming the first filling layer 41 including $SiN_x$ using the PECVD process may include, for example, but not limited to, silicon hydrides ($SiH_x$), in addition to nitrogen or ammonia. Other parameters for performing the PECVD process may be adjusted according to practical needs.

It is noted that, the first filling layer 41 including, for example, $SiO_x$, formed by the PECVD process, may have a relatively low density, such as ranging from about 2.0 g/cm$^3$ to about 2.1 g/cm$^3$. In addition, the first filling layer 41 may be relatively soft, and when subjected to a planarization process, such as a chemical-mechanical planarization (CMP) process, would be polished at a relatively high polishing rate. Moreover, the first filling layer 41 including, for example, $SiO_x$, with the relatively low density, when subjected to an etchant, for example, but not limited to, buffered hydrofluoric acid (BHF), would be etched at a relatively high etching rate.

Figure 5:
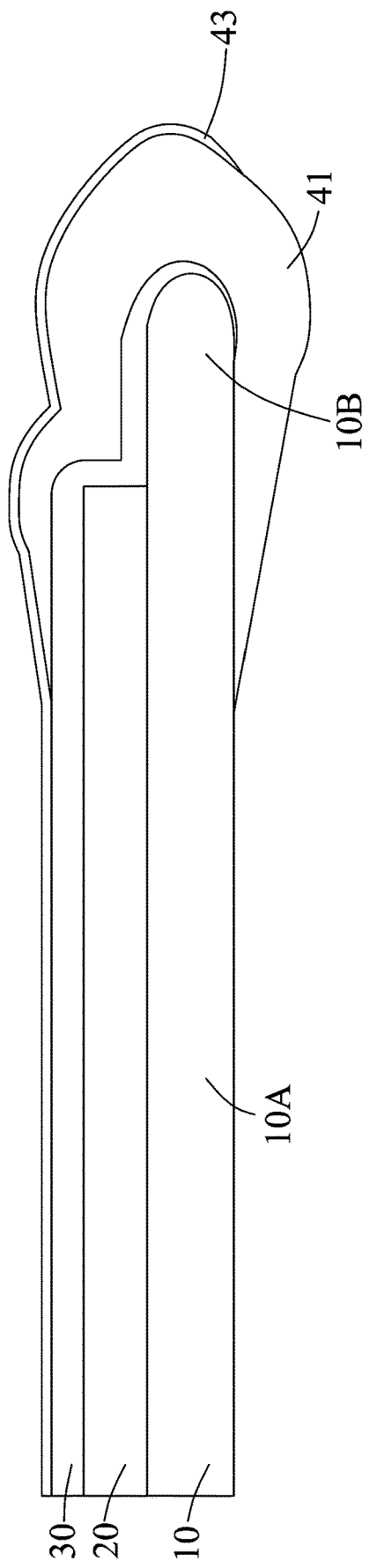

Referring to FIG. 1 and the example illustrated in FIG. 5, the method proceeds to step 104, where a polishing stop layer 43 is formed over the first filling layer 41 and over the semiconductor device 20, and also over the protective layer 30 if step 102 is performed.

The polishing stop layer 43 is configured as an end point for the CMP process to be performed subsequently in step 106, which is capable of protecting the first filling layer 41 from being damaged by the CMP process, especially when the first filling layer 41 is soft. The polishing stop layer 43 is formed with a thickness ranging from about 1 nm to about 100 nm, depending on consumption thereof in the subsequent CMP process.

The polishing stop layer 43 may include a third dielectric material. Examples of the third dielectric material are silicon oxide ($SiO_x$), silicon nitride ($SiN_x$), silicon oxynitride (SiON), silicon carbon nitride (SiCN), silicon carbon (SiC), or combinations thereof. Other materials suitable for forming the polishing stop layer 43 are within the contemplated scope of the present disclosure. In some embodiments, the third dielectric material is $SiN_x$. In some embodiments, the third dielectric material is different from the first dielectric material.

The polishing stop layer 43 may be formed by any suitable deposition process, such as CVD, PECVD, HDPCVD, physical vapor deposition (PVD) and ALD. In some embodiments, plasma-enhanced ALD (PEALD) is adopted, such that the polishing stop layer 43 with a good quality, e.g., a more conformal deposition and a uniform thickness thereof, can be obtained. A precursor for forming the polishing stop layer 43 including $SiN_x$ may include, for instance, dichlorosilane (DCS). The PEALD may be performed at a temperature ranging from about 300° C. to about 500° C. Other parameters for performing the PEALD may be adjusted according to practical needs.

Figure 6:
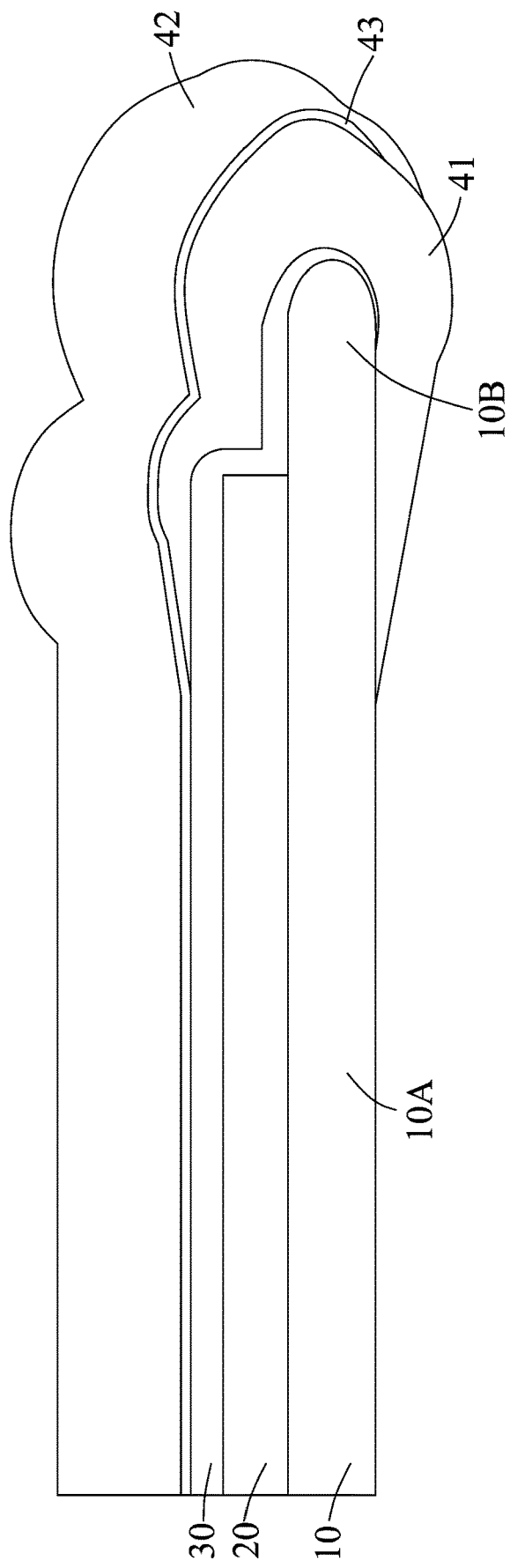

Referring to FIG. 1 and the example illustrated in FIG. 6, the method proceeds to step 105, where a second filling layer 42 is formed over the polishing stop layer 43 after formation of the first filling layer 41 and the polishing layer 43.

On the peripheral region 10B of the device substrate 10, relative to the device substrate 10, all points on an upper surface of the second filling layer 42 opposite to the device substrate 10 are at a level not lower than that of the lowest point on the upper surface of the first filling layer 41 opposite to the device substrate 10, so as to facilitate generation of a planarized surface over the device substrate 10 in step 106 to be performed subsequently without damaging the first filling layer 41.

The second filling layer 42 may include a second dielectric material that is different from the third dielectric material of the polishing stop layer 43. Examples of the second dielectric material are $SiO_x$, $SiN_x$, SiON, SiCN, SiC, or combinations thereof. Other suitable materials for forming the second filling layer 42 are within the contemplated scope of the present disclosure. In some embodiments, the second dielectric material is $SiO_x$.

The second filling layer 42 may be formed by any suitable process, for instance, PECVD, CVD, PVD or ALD. In some embodiments, the second filling layer 42 is formed by a high-density plasma CVD (HDPCVD) process, such that the second filling layer 42 having a good quality, e.g., a relatively high density, is obtained at a relatively low temperature.

The HDPCVD process may be performed at a temperature ranging from about room temperature to about 450° C., and under a pressure ranging from about 1 mTorr to about 100 mTorr. A precursor for forming the second filling layer 42 including, for example, $SiO_x$, using HDPCVD may include $SiH_4$ in addition to oxygen. The parameters for performing the HDPCVD process may be adjusted according to practical needs.

It is noted that, the second filling layer 42, for example, $SiO_x$, formed by the HDPCVD process may have a relatively high density, such as greater than 2.1 g/cm$^3$ and not greater than 2.5 g/cm$^3$. In addition, the second filling layer 41 may be relatively hard, and when subjected to a planarization process, such as a CMP process, would be polished at a relatively low polishing rate. Moreover, the second filling layer 42 including, for example, $SiO_x$, when subjected to an etchant, for example, but not limited to, buffered hydrofluoric acid (BHF), would be etched at a relatively low etching rate.

Figure 7:
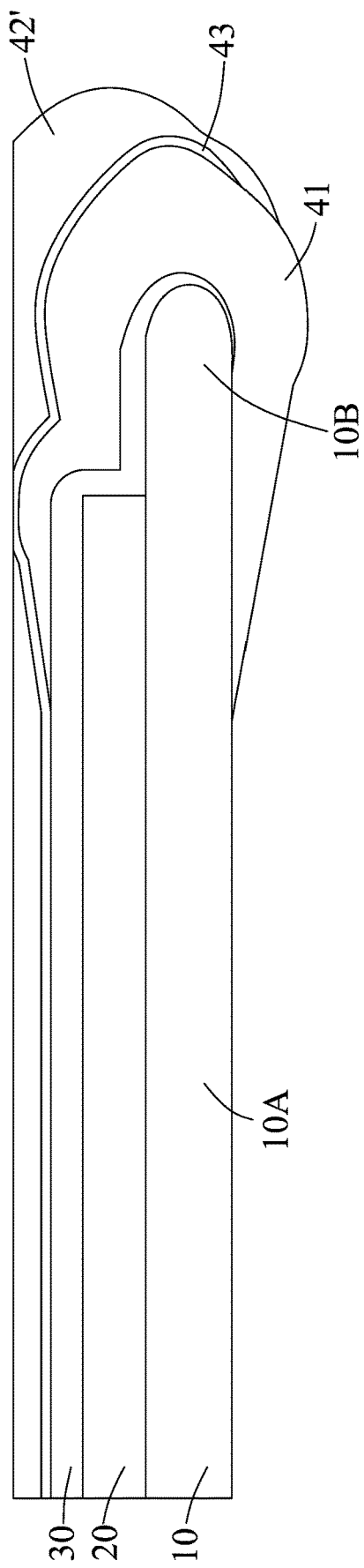

Referring to FIG. 1 and the examples illustrated in FIGS. 6 and 7, the method proceeds to step 106, where a planarization process is performed over the second filling layer 42 to remove a portion of the second filling layer 42, so that a remaining portion of the second filling layer has a planarized surface opposite to the device substrate 10. Hereinafter, the remaining portion of the second filling layer is denoted by the numeral 42'. The planarized surface of the second filling layer 42' is formed to provide a large contact surface for the device substrate 10 to be bonded with the carrier substrate 60 described subsequently in step 109, thereby preventing the semiconductor device 20 from being undesirably damaged during steps performed subsequently.

In some embodiments, the planarization process is a CMP process. Other suitable processes for forming the planarized surface of the second filling layer 42' are within the contemplated scope of the present disclosure. The CMP process is performed over the second filling layer 42, and stops at an end point where a polishing rate of the material at the end point is different from that of the second filling layer 42. In addition, in order to form the planarized surface over the second filling layer 42', the difference between the polishing rates of the second filling layer 42 and the material at the end point may be well controlled to avoid dishing by carefully determining the material of the second filling layer 42 and the material at the end point.

In some exemplary embodiments, the second filling layer 42 (e.g., including $SiO_x$ that has a relatively high density and/or relatively high hardness) has a polishing rate lower than that of the first filling layer 41 (e.g., including $SiO_x$ that has a relatively low density and/or relatively low hardness). In the case that the difference between the polishing rates of the first and second filling layers 41, 42 is not too large, and is considered as well controlled, such first filling layer 41 may serve as the end point of the CMP process, and the polishing stop layer 43 may be omitted (i.e., step 104 may be omitted). In the case that the difference between the polishing rates of the first and second filling layers 41, 42 is too large, and is considered as not well controlled, e.g., the polishing rate of the first filling layer 41 is very high, such first filling layer 41 is liable to dishing, i.e., an excessive amount of the first filling layer 41 may be removed before the CMP process is completed. As a result, it is less likely to achieve the desired planarized surface over the second filling layer 42'. Therefore, in such case, step 104 is performed to form the polishing stop layer 43, e.g., including $SiN_x$, which is disposed to act as the end point of the CMP process, and in step 106, the CMP process starts at the second filling layer 42 and stops when reaching the polishing stop layer 43.

Alternatively, in some cases, for instance, when the first filling layer 41, e.g., including $SiN_x$, has a polishing rate different from that of the second filling layer 42, e.g., including $SiO_x$, and the difference of polishing rates of the first and second filling layers 41, 42 is not too large, and is considered as well controlled, such first filling layer 41 can already serve as the end point of the CMP process without removing an excess amount thereof. In such case, the polishing stop layer 43 is also optional, i.e., step 104 may be omitted.

Figure 8:
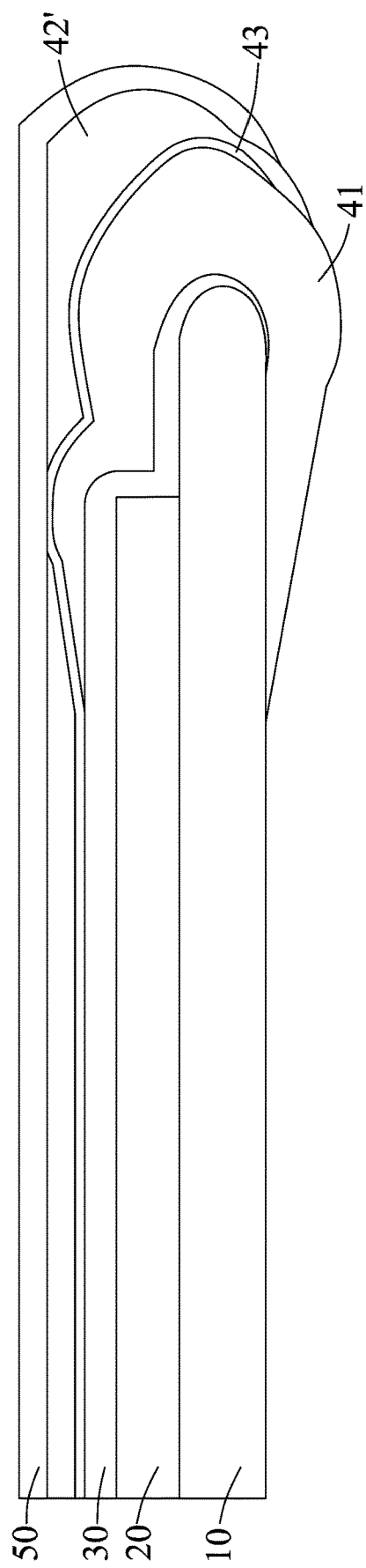

Referring to FIG. 1 and the example illustrated in FIG. 8, the method proceeds to step 107, where a device bonding layer 50 is formed over the planarized surface of the remaining portion of the second filling layer 42'.

The device bonding layer 50 covers the polishing stop layer 43, or the first filling layer 41 that is exposed from the planarized surface of the second filling layer 42' after performing the CMP process so as to facilitate a bonding process to be performed subsequently in step 109. The device bonding layer 50 may have a thickness ranging from about 10 nm to about 100 nm. In certain embodiments, the device bonding layer 50 may include, for example, but not limited to, $SiO_x$, $SiN_x$, or a combination thereof. Other suitable materials for forming the device bonding layer 50 are within the contemplated scope of the present disclosure.

The device bonding layer 50 may be formed by any suitable deposition process, for instance, but not limited to, HDPCVD, PECVD, LPCVD, CVD, ALD, PEALD, or PVD. In certain embodiments, the device bonding layer 50 may be formed by PECVD from, for instance, a precursor including silane, in addition to oxygen. In other embodiments, the device bonding layer 50 may be formed by PEALD from, for instance, a precursor including bis(diethylamino)silane (SAM-24, or BDEAS) in an oxygen plasma. Other suitable processes for forming the device bonding layer 50 are within the contemplated scope of the present disclosure. In some embodiments, the device bonding layer 50 is formed by HDPCVD from, for instance, a precursor including silane, in addition to oxygen.

Figure 9:
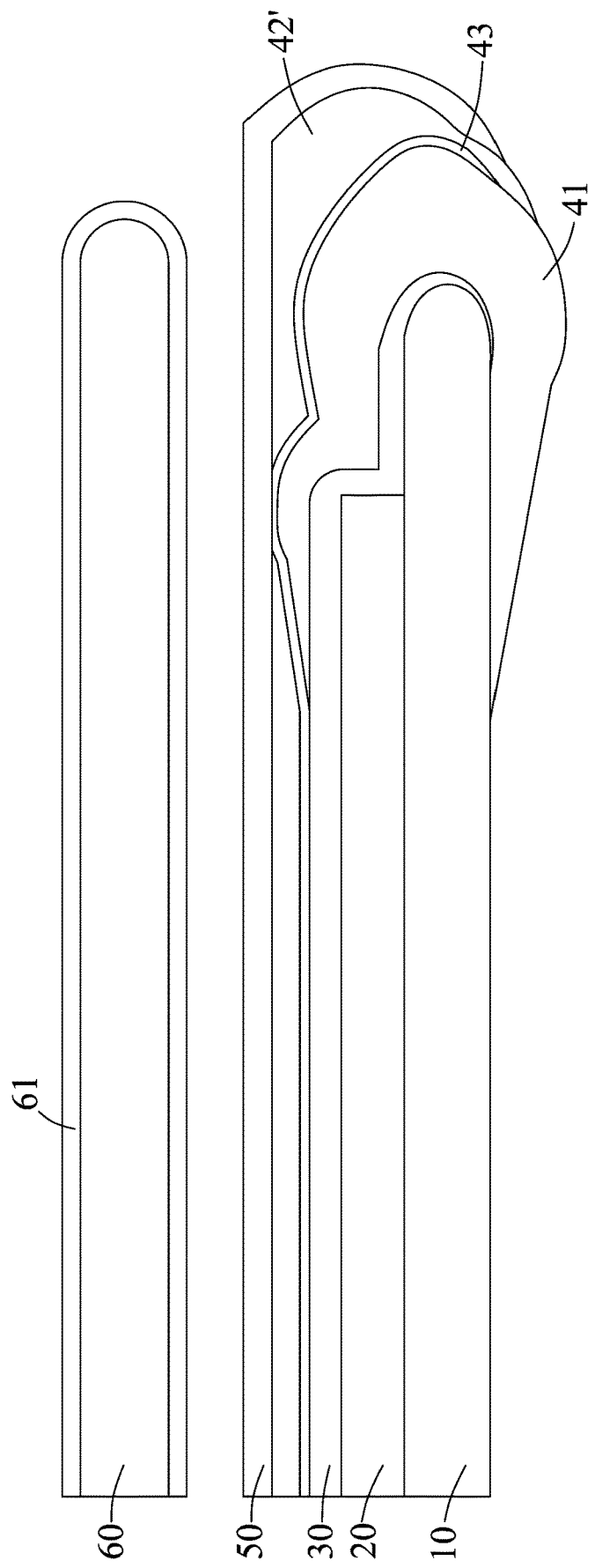
Figure 10:
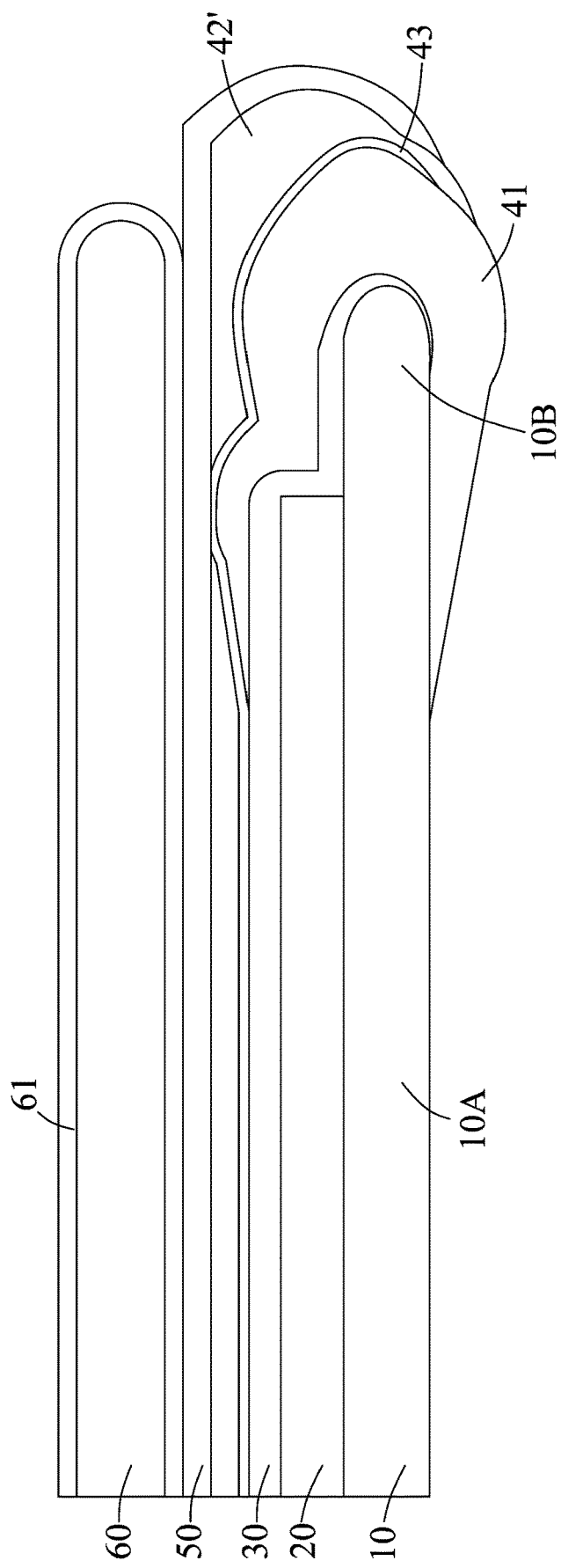

Referring to FIG. 1 and the example illustrated in FIG. 9, the method proceeds to step 108, where a carrier bonding layer 61 is formed over a carrier substrate 60.

The carrier substrate 60 may include any suitable material, such as similar to that of the device substrate 10, and will not be discussed in detail for the sake of brevity. Other materials suitable for the carrier substrate 60 are within the contemplated scope of the present disclosure. In some embodiments, the carrier substrate 60 is a blank substrate. The carrier substrate 60 may have a predetermined thickness according to practical needs.

The carrier bonding layer 61 may include, for example, but not limited to, $SiO_x$, $SiN_x$, or a combination thereof. Other suitable materials for forming the carrier bonding layer 61 are within the contemplated scope of the present disclosure. The carrier bonding layer 61 may have a thickness ranging from about 10 nm to about 100 nm.

The carrier bonding layer 61 may be formed in a manner similar to that of the device bonding layer 50, and the details thereof are omitted for the sake of brevity. In addition, the carrier bonding layer 61 including $SiO_x$ may also be formed by a thermal oxidation process at a temperature ranging from about 800° C. to about 1200° C. in the presence of water and/or oxygen. Other suitable processes for forming the carrier bonding layer 61 are within the contemplated scope of the present disclosure.

In certain embodiments, step 108 may be performed at any step prior to step 109 (to be discussed in the following paragraph).

Referring to FIG. 1 and the examples illustrated in FIG. 10, the method proceeds to step 109, where the device substrate 10 is bonded to the carrier substrate 60 through the first filling layer 41, the remaining portion of the second filling layer 42', the device bonding layer 50, and the carrier bonding layer 61.

In certain embodiments, step 109 includes sub-steps: (i) subjecting the device bonding layer 50 and the carrier bonding layer 61 to a plasma treatment; (ii) rinsing the device bonding layer 50 and the carrier bonding layer 61 with water; (iii) aligning and bringing the device bonding layer 50 and the carrier bonding layer 61 toward each other; (iv) applying a force onto a center of an upper surface of the device substrate 10 opposite to the carrier substrate 60 (or a center of an upper surface of the carrier substrate 60 opposite to the device substrate 10); and (v) annealing the device substrate 10, the semiconductor device 20, the protective layer 30, the first filling layer 41, the polishing stop layer 43, the second filling layer 42', the bonding layer 50, the carrier substrate 60 and the carrier bonding layer 61, so as to obtain the semiconductor structure shown in FIG. 10.

For the device bonding layer 50 and the carrier bonding layer 61 that include $SiN_x$, prior to sub-step (i), a plasma treatment or an oxidation process may be performed so as to convert $SiN_x$ into $SiO_x$.

In sub-step (i), the plasma treatment aims to break Si—O—Si bonds on surface regions of the device bonding layer 50 and the carrier bonding layer 61 into Si—O bonds. In sub-step (ii), the rinsing process aims to form a water film over each of the surface regions of the device bonding layer 50 and the carrier bonding layer 61, thereby forming Si—OH bonds thereon. Such Si—OH bonds also form hydrogen bonds with water molecules. In sub-step (iii), as the device bonding layer 50 and the carrier bonding layer 61 are brought in contact, the Si—OH bonds polymerize to result in Si—O—Si, and water molecules. In sub-step (iv), the force applied permits water to diffuse away from an interface between the device bonding layer 50 and the carrier bonding layer 61, and the device bonding layer 50 starts to adhere with the carrier bonding layer 61. In sub-step (v), the annealing process further removes any water molecule present at the interface between the device bonding layer 50 and the carrier bonding layer 61.

Other suitable processes or steps for bonding the device substrate 10 and the carrier substrate 60 together are within the contemplated scope of the present disclosure. After completing step 109, the semiconductor structure according to the disclosure is obtained.

Such semiconductor structure may be further processed so as to be utilized in different applications. For instance, in certain embodiments, the thus obtained semiconductor structure is flipped over, and the device substrate 10 may be subjected to a planarization process e.g., a CMP process, so as to expose the semiconductor device 20 for further processing. In other embodiments, an optional step of removing an excess portion of the first filling layer 41, and/or the second filling layer 42', and/or the polishing stop layer 43, and/or the device bonding layer 50 that is (are) located at a bottom side of the device substrate 10 opposite to the semiconductor device 20 may be performed.

To be noted is that some steps in the method may be modified, replaced, or eliminated without departure from the spirit and scope of the present disclosure, and those steps may not be in the order mentioned above. In some alternative embodiments, the semiconductor structure may further include additional features, and/or some features present in the semiconductor structure may be modified, replaced, or eliminated without departure from the spirit and scope of the present disclosure.

The embodiments of the present disclosure have the following advantageous features. By virtue of forming the first filling layer and the second filling layer, any voids between the carrier substrate and the device substrate, especially on the peripheral region of the device substrate, which is conventionally left unoccupied resulting in a great non-bonding area, are filled so as to effectively reduce such non-bonding area, thereby enhancing the bonding between the device substrate and the carrier substrate, and thereby more dies or chips may be reserved. In addition, the second filling layer and the polishing stop layer, (or the second filling layer and the first filling layer in the case that the polishing stop layer is omitted) cooperate to effectively form a planarized surface over the device substrate, which is also conducive for increasing contact surface between the device substrate and the carrier substrate, thereby improving bonding therebetween.

In accordance with some embodiments of the present disclosure, a method for manufacturing a semiconductor structure includes: forming a semiconductor device on a main region of the device substrate, the device substrate having a peripheral region surrounding the main region; forming a first filling layer on the peripheral region of the device substrate; forming a second filling layer over the first filling layer and the semiconductor device after forming the first filling layer, the second filling layer having a polishing rate different from that of the first filling layer; performing a planarization process over the second filling layer to remove a portion of the second filling layer so that a remaining portion of the second filling layer has a planarized surface opposite to the device substrate; and bonding the device substrate to a carrier substrate through the first filling layer and the remaining portion of the second filling layer.

In accordance with some embodiments of the present disclosure, the first filling layer is formed on and extends from the peripheral region of the device substrate to cover an end portion of the semiconductor device, leaving a major portion of the semiconductor device steering clear of the first filling layer.

In accordance with some embodiments of the present disclosure, the first filling layer includes a first dielectric material which has at least one of an oxide, a nitride, and a carbide.

In accordance with some embodiments of the present disclosure, the first filling layer is formed with a maximal thickness (T) ranging from 0.5 μm to 3.0 μm.

In accordance with some embodiments of the present disclosure, the first filling layer is formed by: disposing a blocking element above the semiconductor device opposite to the device substrate; and performing a deposition process so as to form the first filling layer on the peripheral region of the device substrate.

In accordance with some embodiments of the present disclosure, the first filling layer is formed by a plasma enhanced chemical vapor deposition process.

In accordance with some embodiments of the present disclosure, the second filling layer is formed by a high-density plasma chemical vapor deposition process.

In accordance with some embodiments of the present disclosure, after forming the first filling layer and prior to forming the second filling layer, the method for manufacturing the semiconductor structure further includes forming a polishing stop layer over the first filling layer. The polishing stop layer has a polishing rate different from that of the second filling layer so as to permit the planarization process to stop at the polishing stop layer.

In accordance with some embodiments of the present disclosure, the polishing stop layer is formed by an atomic layer deposition process.

In accordance with some embodiments of the present disclosure, the first filling layer is formed to wrap the peripheral region of the device substrate in a manner that the first filling layer is formed with a thickness that gradually decreases toward the main region of the device substrate.

In accordance with some embodiments of the present disclosure, prior to forming the first filling layer, the method for manufacturing the semiconductor structure further includes forming a protective layer over the semiconductor device and the device substrate.

In accordance with some embodiments of the present disclosure, after performing the planarization process, and prior to bonding the device substrate with the carrier substrate, the method for manufacturing the semiconductor structure further includes forming a device bonding layer over the planarized surface of the remaining portion of the second filling layer.

In accordance with some embodiments of the present disclosure, prior to bonding the device substrate with the carrier substrate, the method for manufacturing the semiconductor structure further includes forming a carrier bonding layer over the carrier substrate.

In accordance with some embodiments of the present disclosure, a semiconductor structure includes: a device substrate having a main region and a peripheral region surrounding the main region; a semiconductor device disposed on the main region of the device substrate; a first filling layer disposed on the peripheral region of the device substrate, and including a first dielectric material which has at least one of an oxide, a nitride, and a carbide; a second filling layer disposed on the first filling layer and the semiconductor device; and a carrier substrate bonded to the device substrate through the first filling layer and the second filling layer.

In accordance with some embodiments of the present disclosure, the semiconductor structure further includes a polishing stop layer disposed between the first filling layer and the second filling layer. The polishing stop layer includes a material different from that of the second filling layer.

In accordance with some embodiments of the present disclosure, the first filling layer is disposed on and extends from the peripheral region of the device substrate to cover an end portion of the semiconductor device, leaving a major portion steering clear of the first filling layer.

In accordance with some embodiments of the present disclosure, the second filling layer includes a second dielectric material which has at least one of an oxide, a nitride, and a carbide, and has a density higher than that of the first filling layer.

In accordance with some embodiments of the present disclosure, a method for manufacturing a semiconductor structure includes: forming a semiconductor device on a main region of the device substrate, the device substrate having a peripheral region surrounding the main region; forming a first filling layer to surround the semiconductor device so that the first filling layer is disposed on and extends from the peripheral region of the device substrate to cover an end portion of the semiconductor device; forming a second filling layer over the first filling layer and the semiconductor device after forming the first filling layer, the second filling layer having a density higher than that of the first filling layer; performing a planarization process over the second filling material layer to remove a portion of the second filling layer so that a remaining portion of the second filling layer has a planarized surface opposite to the device substrate; and bonding the device substrate with a carrier substrate through the first filling layer and the remaining portion of the second filling layer.

In accordance with some embodiments of the present disclosure, the first and second filling layers each independently includes silicon oxide ($SiO_x$), silicon nitride (SiN), silicon oxynitride (SiON), silicon carbon nitride (SiCN), silicon carbon (SiC), or combinations thereof.

In accordance with some embodiments of the present disclosure, the first filling layer has a polishing rate which is different from that of the second filling layer.

The foregoing outlines features of several embodiments so that those skilled in the art may better understand the aspects of the present disclosure. Those skilled in the art should appreciate that they may readily use the present disclosure as a basis for designing or modifying other processes or structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor structure, comprising:
   forming a semiconductor device on a main region of a device substrate, the device substrate having a peripheral region surrounding the main region;
   forming a first filling layer on the peripheral region of the device substrate, the first filling layer extending from the peripheral region of the device substrate to cover an end portion of the semiconductor device, leaving a major portion of the semiconductor device steering clear of the first filling layer;
   forming a second filling layer over the first filling layer and the semiconductor device after forming the first filling layer, the second filling layer having a polishing rate different from that of the first filling layer;
   performing a planarization process over the second filling layer to remove a portion of the second filling layer so that a remaining portion of the second filling layer has a planarized surface opposite to the device substrate; and
   bonding the device substrate to a carrier substrate through the first filling layer and the remaining portion of the second filling layer.

2. The method according to claim 1, wherein the first filling layer includes a first dielectric material which has at least one of an oxide, a nitride, and a carbide.

3. The method according to claim 1, wherein the first filling layer is formed with a maximal thickness ranging from 0.5 μm to 3.0 μm.

4. The method according to claim 1, wherein the first filling layer is formed by:
   disposing a blocking element above the semiconductor device opposite to the device substrate, and
   performing a deposition process so as to form the first filling layer on the peripheral region of the device substrate.

5. The method according to claim 1, wherein the first filling layer is formed to wrap the peripheral region of the device substrate in a manner that the first filling layer is formed with a thickness that gradually decreases toward the main region of the device substrate.

6. The method according to claim 1, wherein prior to forming the first filling layer, further comprising forming a protective layer over the semiconductor device and the device substrate.

7. The method according to claim 1, after performing the planarization process, and prior to bonding the device substrate with the carrier substrate, further comprising forming a device bonding layer over the planarized surface of the remaining portion of the second filling layer.

8. The method according to claim 1, wherein prior to bonding the device substrate with the carrier substrate, further comprising forming a carrier bonding layer over the carrier substrate.

9. The method according to claim 1, wherein the first filling layer is formed by a plasma enhanced chemical vapor deposition process.

10. The method according to claim 9, wherein the second filling layer is formed by a high-density plasma chemical vapor deposition process.

11. The method according to claim 1, after forming the first filling layer and prior to forming the second filling layer, further comprising forming a polishing stop layer over the first filling layer, the polishing stop layer having a polishing rate different from that of the second filling layer so as to permit the planarization process to stop at the polishing stop layer.

12. The method according to claim 11, wherein the polishing stop layer is formed by an atomic layer deposition process.

13. A method for manufacturing a semiconductor structure, comprising:
   forming a semiconductor device on a main region of a device substrate, the device substrate having a peripheral region surrounding the main region;

forming a first filling layer to surround the semiconductor device so that the first filling layer is disposed on and extends from the peripheral region of the device substrate to cover an end portion of the semiconductor device, leaving a major portion of the semiconductor device steering clear of the first filling layer;

forming a second filling layer over the first filling layer and the semiconductor device after forming the first filling layer, the second filling layer having a density higher than that of the first filling layer;

performing a planarization process over the second filling material layer to remove a portion of the second filling layer so that a remaining portion of the second filling layer has a planarized surface opposite to the device substrate; and bonding the device substrate to a carrier substrate through the first filling layer and the remaining portion of the second filling layer.

14. The method according to claim 13, wherein the first and second filling layers each independently includes silicon oxide ($SiO_x$), silicon nitride ($SiN_x$), silicon oxynitride (SiON), silicon carbon nitride (SiCN), silicon carbon (SiC), or combinations thereof.

15. The method according to claim 13, wherein the first filling layer has a polishing rate which is different from that of the second filling layer.

16. A method for manufacturing a semiconductor structure, comprising:
forming a device substrate having a main region and a peripheral region surrounding the main region;
forming a semiconductor device disposed on the main region of the device substrate;
forming a first filling layer disposed on the peripheral region of the device substrate, the first filling layer includes a first dielectric material;
forming a second filling layer disposed on the first filling layer and the semiconductor device, the second filling layer includes a second dielectric material;
forming a polishing stop layer disposed between the first filling layer and the second filling layer, the polishing stop layer being made of a material different from that of the second dielectric material;
planarizing the second filling layer until the polishing stop layer is exposed; and
bonding a carrier substrate to the device substrate through the first filling layer, the polishing stop layer, and the planarized second filling layer.

17. The method according to claim 16, wherein the first filling layer has a non-uniform thickness.

18. The method according to claim 16, wherein:
the first filling layer is formed with a maximal thickness ranging from 0.5 μm to 3.0 μm; and
the polishing stop layer is formed with a thickness ranging from 1 nm to 100 nm.

19. The method according to claim 16, wherein the second filling layer has a density higher than that of the first filling layer.

20. The method according to claim 16, wherein the first filling layer is formed on and extends from the peripheral region of the device substrate to cover an end portion of the semiconductor device, leaving a major portion of the semiconductor device steering clear of the first filling layer.

* * * * *